(12) United States Patent
Lee et al.

(10) Patent No.: US 8,901,459 B2
(45) Date of Patent: Dec. 2, 2014

(54) SUBSTRATE SUPPORTING UNITS AND SUBSTRATE TREATING APPARATUSES INCLUDING THE SAME

(75) Inventors: Wonhaeng Lee, Chungcheongnam-do (KR); Seungbae Lee, Gyeonggi-do (KR)

(73) Assignee: Semes Co. Ltd., Chungcheongnam-do (KR)

( * ) Notice: Subject to any disclaimer, the term of this patent is extended or adjusted under 35 U.S.C. 154(b) by 105 days.

(21) Appl. No.: 13/535,005

(22) Filed: Jun. 27, 2012

(65) Prior Publication Data

US 2013/0001213 A1 Jan. 3, 2013

(30) Foreign Application Priority Data

Jun. 30, 2011 (KR) .................. 10-2011-0064986
Oct. 6, 2011 (KR) .................. 10-2011-0101973

(51) Int. Cl.
*F27D 11/00* (2006.01)
*H01L 21/67* (2006.01)
*F26B 19/00* (2006.01)

(52) U.S. Cl.
CPC .............................. *H01L 21/67103* (2013.01)
USPC ....................................................... 219/385

(58) Field of Classification Search
USPC .................. 219/390, 405, 411, 443.1, 444.1; 392/416, 418; 118/724, 725, 50.1, 118/723 E
See application file for complete search history.

(56) References Cited

U.S. PATENT DOCUMENTS

| | | | |
|---|---|---|---|
| 2007/0258186 | A1 | 11/2007 | Matyushkin |
| 2010/0043708 | A1* | 2/2010 | Choi et al. ............... 118/723 E |

FOREIGN PATENT DOCUMENTS

| | | |
|---|---|---|
| CN | 1708190 | 12/2005 |
| JP | 11-185940 | 7/1999 |
| JP | 2005-026120 | 1/2005 |
| JP | 2005-32933 | 2/2005 |
| JP | 2010-199493 | 9/2010 |
| KR | 10-0615737 B1 | 8/2006 |
| TW | 200807612 | 2/2008 |
| TW | 201010493 | 3/2010 |

OTHER PUBLICATIONS

Taiwanese Office Action for Application No. 101123465 dated May 5, 2014.
Chinese Examination Report for Application No. 2012/10216931 dated Jul. 3, 2014.

* cited by examiner

*Primary Examiner* — Shawntina Fuqua
(74) *Attorney, Agent, or Firm* — Jenkins, Wilson, Taylor & Hunt, P.A.

(57) ABSTRACT

Provided is a substrate supporting unit, which includes a support plate on which a substrate is placed, and a heating member disposed within the support plate to heat the support plate. The heating member includes a plurality of first heating wires disposed in a first region of the support plate, and a plurality of second heating wires disposed in a second region of the support plate, which is different from the first region. The first heating wires are connected to each other through one of a series connection and a parallel connection, and the second heating wires are connected to each other through the other of the series connection and the parallel connection.

9 Claims, 4 Drawing Sheets

SUBSTRATE SUPPORTING UNITS AND SUBSTRATE TREATING APPARATUSES INCLUDING THE SAME

CROSS-REFERENCE TO RELATED APPLICATIONS

This application claims priority under 35 U.S.C. §119 to Korean Patent Application Nos. 10-2011-0064986, filed on Jun. 30, 2011, and 10-2011-0101973, filed on Oct. 6, 2011, the entireties of which are both hereby incorporated by reference.

TECHNICAL FIELD

The present invention disclosed herein relates to a substrate supporting unit, and more particularly, to a substrate supporting unit including a heater.

BACKGROUND

Semiconductor fabrication apparatuses include a support plate in a process chamber to support a substrate. Heating wires are disposed within the support plate to heat the substrate to a certain temperature.

Such heating wires are embedded in a spiral pattern, and are connected in parallel to one another. In this case, since the entire length of the parallel-connected heating wires is greater than that of series-connected heating wires, the parallel-connected heating wires can be arrayed with smaller intervals. However, since the entire length of parallel-connected heating wires is greater than that of series-connected heating wires, parallel-connected heating wires are inappropriate to be embedded in a small area. Furthermore, as parallel-connected heating wires extend toward the edge of a support plate, the length thereof is increased, and the resistance thereof is also increased. Thus, it may be difficult to obtain a desired amount of heat.

SUMMARY OF THE INVENTION

The present invention provides an apparatus for uniformly treating the entire surface of a substrate.

Embodiments of the present invention provide substrate supporting units including: a support plate on which a substrate is placed; and a heating member disposed within the support plate to heat the support plate, wherein the heating member includes: a plurality of first heating wires disposed in a first region of the support plate; and a plurality of second heating wires disposed in a second region of the support plate, which is different from the first region, wherein the first heating wires are connected to each other through one of a series connection and a parallel connection, and the second heating wires are connected to each other through the other of the series connection and the parallel connection.

In some embodiments, the first heating wires may be connected to each other in parallel, the second heating wires may be connected to each other in series, and the second region may have an area smaller than that of the first region.

In other embodiments, the first region may be a center region of the support plate, and the second region may be an edge region of the support plate surrounding the center region.

In still other embodiments, respective lengths of the first heating wires may be greater than respective lengths of the second heating wires.

In even other embodiments, respective lengths of the first heating wires may be different from each other.

In other embodiments of the present invention, substrate treating apparatuses include: a process chamber having an inner space; a support plate disposed within the process chamber to support a substrate; and a heating member disposed within the support plate to heat the support plate, wherein the heating member includes: a plurality of first heating wires disposed in a center region of the support plate; and a plurality of second heating wires disposed in an edge region of the support plate surrounding the center region, wherein the first heating wires are connected to each other through one of a series connection and a parallel connection, and the second heating wires are connected to each other through the other of the series connection and the parallel connection.

In some embodiments, the first heating wires may be connected to each other in parallel, the second heating wires may be connected to each other in series, and the edge region may have an area smaller than that of the center region.

In other embodiments, respective lengths of the first heating wires may be greater than respective lengths of the second heating wires.

In still other embodiments, respective lengths of the first heating wires may be different from each other.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, substrate supporting units and substrate treating apparatuses according to preferred embodiments of the present invention will be described in detail with reference to the accompanying drawings. Detailed descriptions related to well-known functions or configurations will be ruled out in order not to unnecessarily obscure subject matters of the present invention.

Figure 1:
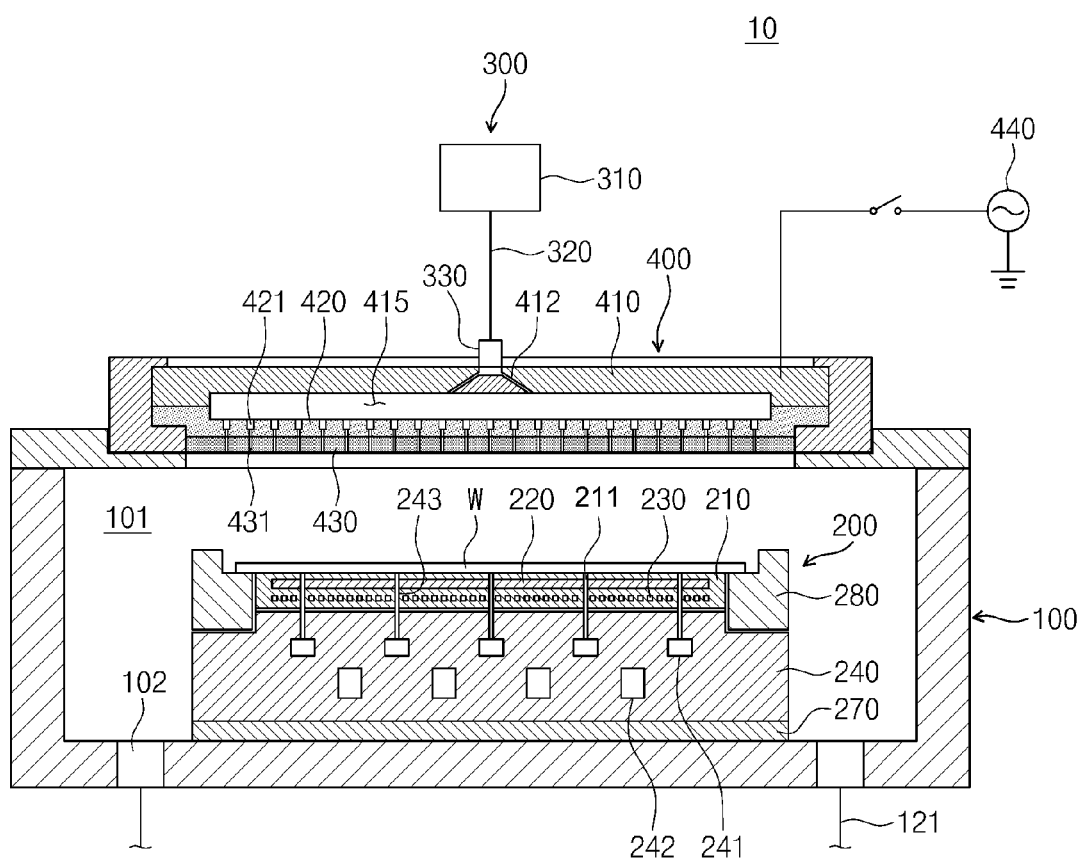
FIG. 1 is a cross-sectional view illustrating an apparatus for treating a substrate according to an embodiment of the present invention.

FIG. 1 is a cross-sectional view illustrating an apparatus for treating a substrate according to an embodiment of the present invention. Referring to FIG. 1, a substrate treating apparatus 10 according to the current embodiment generates plasma to treat a substrate. The substrate treating apparatus 10 includes a process chamber 100, a substrate supporting unit 200, a gas supply part 300, and a plasma generation part 400.

The process chamber 100 has an inner space 101. The inner space 101 functions as a space for treating a substrate W with plasma. A plasma treatment process for the substrate W includes an etching process. An exhausting hole 102 is disposed in the bottom of the process chamber 100. The exhausting hole 102 is connected to an exhausting line 121. Gas staying within the process chamber 100, and reaction byproducts generated during a substrate treating process may be discharged through the exhausting line 121. At this point, the pressure of the inner space 101 is decreased to certain pressure.

The substrate supporting unit 200 is disposed within the process chamber 100. The substrate supporting unit 200 supports the substrate W. The substrate supporting unit 200 includes a support plate 210 and a heating member 230. The support plate 210 supports the substrate W. The heating member 230 is disposed within the support plate 210, and heats the support plate 210. Heat generated from the heating member 230 is transferred to the substrate W through the support plate 210. According to the current embodiment, an electrostatic chuck holding the substrate W by using an electrostatic force is used as the substrate supporting unit 200. In addition, a dielectric plate disposed in the upper end of the electrostatic chuck (also denoted by 200) is used as the support plate 210. The dielectric plate (also denoted by 210) is provided in a disc-shaped dielectric substance. The substrate W is placed on the top surface of the dielectric plate 210. The top surface of the dielectric plate 210 has a radius smaller than that of the substrate W. As a result, the edge of the substrate W is positioned outside the dielectric plate 210. First supply channels 211 are formed in the dielectric plate 210. The first supply channels 211 extend from the top surface of the dielectric plate 210 to the bottom surface thereof. The first supply channels 211 are spaced apart from one another, and are provided as paths for supplying a heat transfer medium to the bottom surface of the substrate W.

A lower electrode 220 is embedded in the dielectric plate 210. The lower electrode 220 is electrically connected to an external power source (not shown). The external power source includes a direct current (DC) power source. DC current is applied to the lower electrode 220 to form an electric field on the lower electrode 220. The electric field is applied to the substrate W to cause dielectric polarization between the substrate W and the lower electrode 220. Positive and negative charges are collected between the substrate W and the lower electrode 220 by the dielectric polarization, and electrostatic attraction between the positive and negative charges fixes the substrate W to the dielectric plate 210.

The heating member 230 is embedded in the dielectric plate 210. The heating member 230 includes heating wires 231, 232, and 233.

Figure 2:
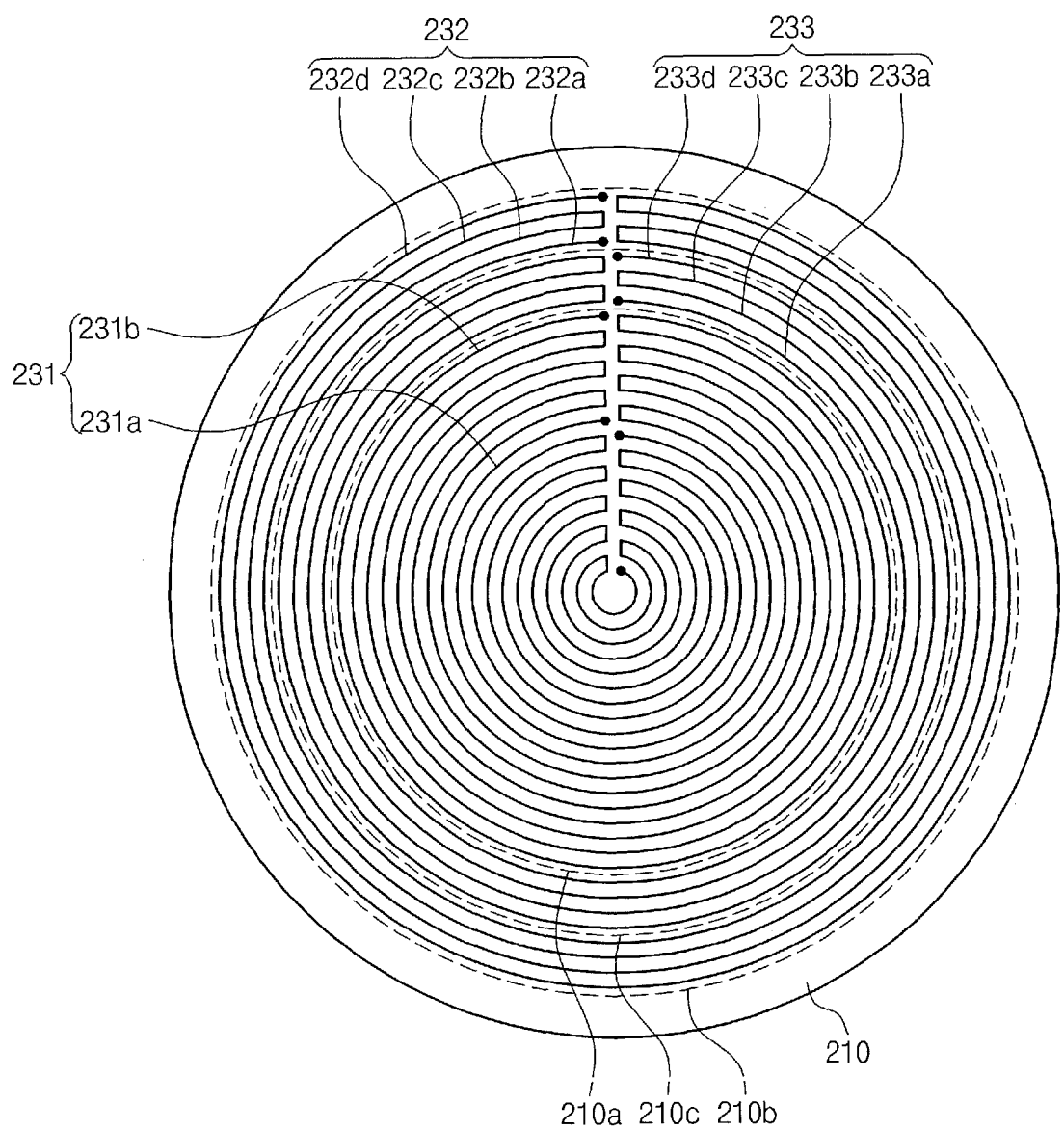
FIG. 2 is a plan view illustrating heating wires of FIG. 1.
Figure 3:
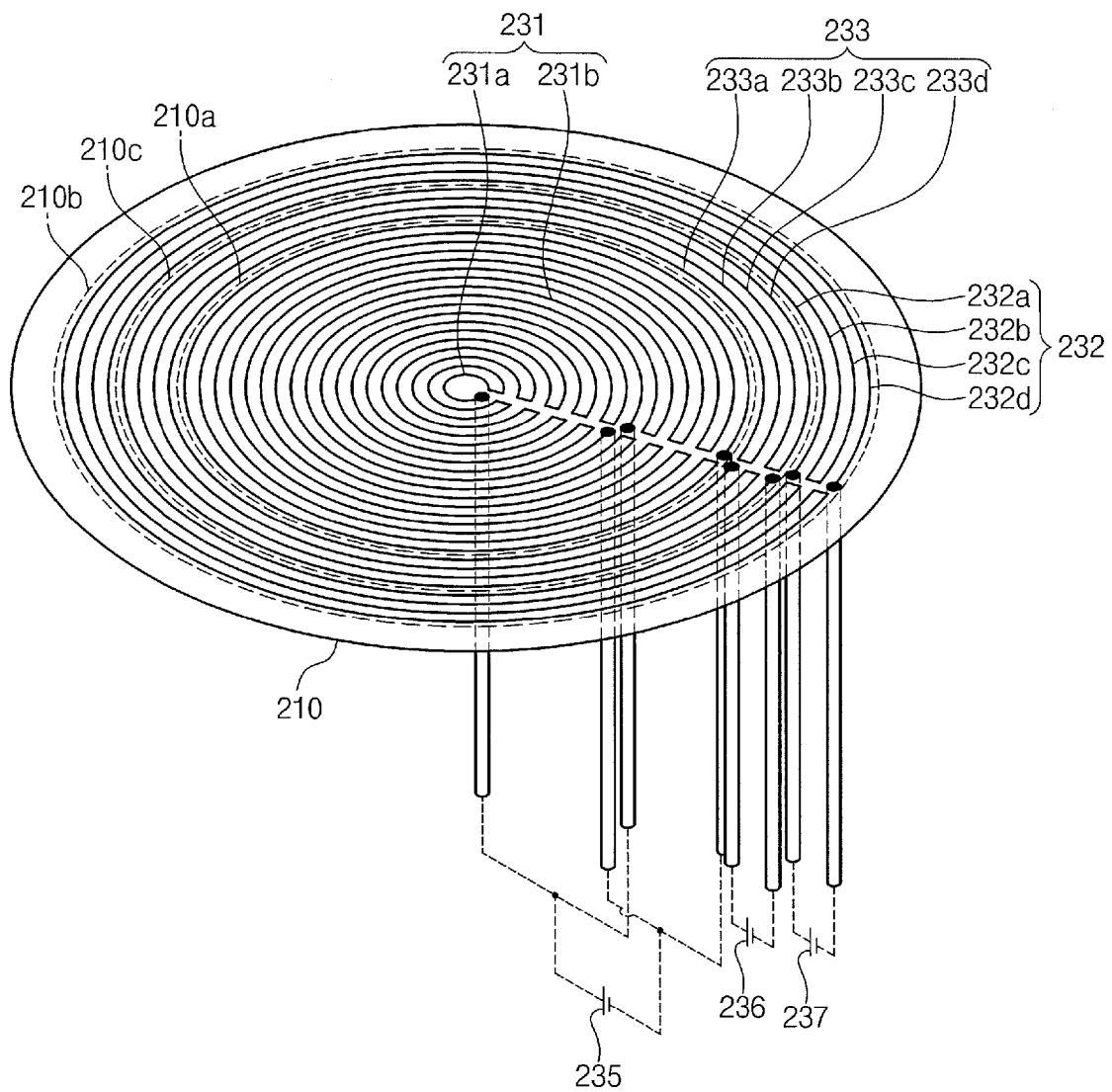
FIG. 3 is a perspective view illustrating the heating wires of FIG. 1.
Figure 4:
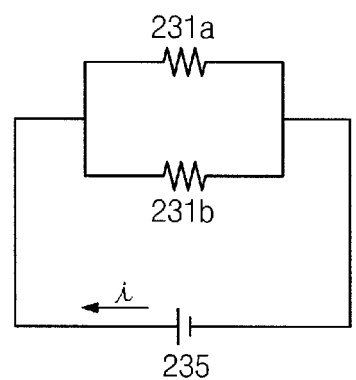
FIG. 4 is a circuit diagram illustrating connection of first heating wires of FIG. 1.

FIG. 2 is a plan view illustrating heating wires of FIG. 1. FIG. 3 is a perspective view illustrating the heating wires of FIG. 1. Referring to FIGS. 2 and 3, the heating wires 231, 232, and 233 are embedded in the dielectric plate 210. The heating wires 231, 232, and 233 are embedded in different regions of the dielectric plate 210, respectively. The heating wires 231, 232, and 233 may be classified into a plurality of groups according to the regions in which the heating wires 231, 232, and 233 are embedded. First heating wires 231 are embedded in a first region 210a of the dielectric plate 210. The first region 210a may correspond to the center region of the dielectric plate 210. The first heating wires 231 include first heating wires 231a and 231b that are electrically connected to each other. The first heating wires 231a and 231b may be connected to each other in series or in parallel. The first heating wires 231a and 231b are connected to a first lower power source 235. Current supplied by the first lower power source 235 flows through the first heating wires 231a and 231b connected in parallel. The first heating wires 231a and 231b generate heat by resisting the current.

Second heating wires 232 are embedded in a second region 210b of the dielectric plate 210. The second region 210b is different from the first region 210a, and is disposed around the first region 210a. The second region 210b is the outermost region of the dielectric plate 210 surrounding the center region thereof. The second region 210b has an area smaller than that of the first region 210a. The second heating wires 232 include second heating wires 232a to 232d that are embedded in the second region 210b. The second heating wires 232a to 232d may be connected to one another in series or in parallel, provided that a connecting method thereof is different from that of the first heating wires 231a and 231b. The second heating wires 232a to 232d are connected to a second lower power source 236. Current supplied by the second lower power source 236 flows through the second heating wires 232a to 232d connected in series. The second heating wires 232a to 232d generate heat by resisting the current.

Third heating wires 233 are embedded in a third region 210c of the dielectric plate 210. The third region 210c is disposed between the first region 210a and the second region 210b, and surrounds the first region 210a. The third region 210c has an area smaller than that of the first region 210a. The third heating wires 233 include third heating wires 233a to 232d that are embedded in the third region 210c. The third heating wires 233a to 233d may be connected to one another in series or in parallel, provided that a connecting method thereof is different from that of the first heating wires 231a and 231b. The third heating wires 233a to 233d are connected to a third lower power source 237. Current supplied by the third lower power source 237 flows through the third heating wires 233a to 233d connected in series. The third heating wires 233a to 233d generate heat by resisting the current.

The heat generated from the first to third heating wires 231, 232, and 233 is transferred to the substrate W through the dielectric plate 210 so as to heat the substrate W. The first to third lower power sources 235 to 237 include DC power sources.

A support plate 240 is positioned under the dielectric plate 210. The bottom surface of the dielectric plate 210 and the top surface of the support plate 240 may be adhered to each other by an adhesive 236. The support plate 240 may be formed of an aluminum material. The top surface of the support plate 240 may have a stepped shape with a center region higher than an edge region. The top center region of the support plate 240 has an area corresponding to that of the bottom surface of the dielectric plate 210, and is adhered thereto. A first circulation channel 241, a second circulation channel 242, and a second supply channel 243 are formed in the support plate 240.

The first circulation channel 241 is provided as a path for circulating the heat transfer medium. The first circulation channel 241 may be formed in a spiral shape within the support plate 240. Alternatively, the first circulation channel 241 may be provided in plurality as ring-shaped channels having concentric circles with different radii. In this case, the first circulation channels 241 may communicate with one another. The first circulation channels 241 are formed at the same height.

The second supply channel 243 extends upward from the first circulation channel 241, and arrives at the top surface of the support plate 240. The number of second supply channels 243 corresponds to the number of the first supply channels 211. The second supply channels 243 connect the first circulation channels 241 to the first supply channels 211. The heat transfer medium circulating through the first circulation channel 241 sequentially passes through the second supply channels 243 and the first supply channels 211, and is then supplied to the bottom surface of the substrate W. The heat transfer fluid functions as a medium whereby the heat transferred from the plasma to the substrate W is transferred to the electrostatic chuck 200. Ion particles contained in the plasma are attracted by electric force formed at the electrostatic chuck 200, and are moved to the electrostatic chuck 200. At this point, the ion particles collide with the substrate W to perform an etching process. While the ion particles collide with the substrate W, heat is generated in the substrate W. The heat generated in the substrate W is transferred to the electrostatic chuck 200 through heat transfer gas supplied to a space between the bottom surface of the substrate W and the top surface of the dielectric plate 210. Accordingly, the substrate W can be maintained at a set temperature. The heat transfer fluid includes inert gas. According to an embodiment of the present invention, the heat transfer fluid includes helium (He) gas.

The second circulation channel 242 is provided as a path for circulating a cooling fluid. The cooling fluid circulates along the second circulation channel 242, and cools the support plate 240. The cooling of the support plate 240 maintains the substrate W at a predetermined temperature by cooling the dielectric plate 210 and the substrate W together. The second circulation channel 242 may be formed in a spiral shape within the support plate 240. Alternatively, the second circulation channel 242 may be provided in plurality as ring-shaped channels having concentric circles with different radii. In this case, the second circulation channels 242 may communicate with one another. The second circulation channel 242 may have a cross-sectional area greater than that of the first circulation channel 241. The second circulation channels 242 are formed at the same height. The second circulation channel 242 may be positioned under the first circulation channel 241.

An insulation plate 270 is provided under the support plate 240. The insulation plate 270 is provided in a size corresponding to that of the support plate 240. The insulation plate 270 is positioned between the support plate 240 and a bottom surface of the process chamber 100. The insulation plate 270 is faulted of an insulation material, and electrically insulates the support plate 240 and the process chamber 100 from each other.

A focus ring 280 is disposed at an edge region of the electrostatic chuck 200. The focus ring 200 has a ring shape, and is disposed around the dielectric plate 210. The top surface of the focus ring 280 may have a stepped shape in which an inside portion thereof adjacent to the dielectric plate 210 is lower than an outside portion thereof. The inside portion of the focus ring 280 is positioned at the same height as that of the top surface of the dielectric plate 210. The inside portion of the focus ring 280 supports the edge region of the substrate W at the outside of the dielectric plate 210. The outside portion of the focus ring 280 surrounds the edge region of the substrate W. The focus ring 280 expands an electric field formation region such that the substrate W is positioned at the center region of the plasma. Accordingly, the plasma is uniformly formed over the entire region of the substrate W, and thus, the entire region of the substrate W can be uniformly etched.

The gas supply part 300 supplies a process gas into the process chamber 100. The gas supply part 300 includes a gas storage part 310, a gas supply line 320, and a gas inflow port 330. The gas supply line 320 connects the gas storage part 310 to the gas inflow port 330, and supplies the process gas from the gas storage part 310 to the gas inflow port 330.

The gas inflow port 330 is connected to gas supply holes 412 disposed in an upper electrode 410, and supplies the process gas to the gas supply holes 412.

The plasma generation part 400 excites the process gas staying within the process chamber 100. The plasma generation part 400 includes the upper electrode 410, a gas distribution plate 420, a shower head 430, and an upper power source 440.

The upper electrode 410 has a disc shape, and is disposed above the electrostatic chuck 200. The upper electrode 410 is electrically connected to the upper power source 440. The upper electrode 410 supplies high frequency power generated from the upper power source 440, into the process chamber 100 to excite the process gas. The process gas is excited to a plasma state. The gas supply holes 412 are disposed in the central region of the upper electrode 410. The gas supply holes 412 are connected to the gas inflow port 330, and supplies gas to a buffer space 415 disposed under the upper electrode 410.

The gas distribution plate 420 is disposed under the upper electrode 410. The gas distribution plate 420 has a disc shape with a size corresponding to the upper electrode 410. The top surface of the gas distribution plate 420 has a stepped shape with a central region lower than an edge region. The top surface of the gas distribution plate 42 and the bottom surface of the upper electrode 410 are combined to form the buffer space 415. Before gas supplied through the gas supply holes 412 is supplied into the inner space 101 of the process chamber 100, the gas temporarily stays in the buffer space 415. First distribution holes 421 are disposed in the central region of the gas distribution plate 420. The first distribution holes 421 extend from the top surface of the gas distribution plate 420 to the bottom surface thereof. The first distribution holes 421 are spaced a constant distance from one another. The first distribution holes 421 are connected to the buffer space 415.

The shower head 430 is positioned under the gas distribution plate 420. The shower head 430 has a disk shape. Second distribution holes 431 are disposed in the shower head 430. The second distribution holes 431 extend from the top surface of the shower head 430 to the bottom surface thereof. The second distribution holes 431 are spaced a constant distance from one another. The number and position of the first distribution holes 421 correspond to those of the second distribution holes 431. The second distribution holes 431 are connected to the first distribution holes 421, respectively. The process gas staying within the buffer space 415 is uniformly supplied into the process chamber 100 through the first and second distribution holes 421 and 431.

As described above, the first heating wires 231a and 231b may be connected in parallel, and the second heating wires 232a to 232d may be connected in series, and the third heating wires 233a to 233d may be connected in series The first heating wires 231a and 231b constitute a circuit as illustrated in FIG. 3, unlike the second heating wires 232a to 232d and the third heating wires 233a to 233d.

To obtain a target resistance of about 30Ω from heating wires embedded in a certain area of the dielectric plate 210, two heating wires having a resistance of about 60Ω are connected to each other in parallel, or a single heating wire having a resistance of about 30Ω is provided. When heating wires have the same cross sectional area, the entire length of parallel-connected heating wires is about four times greater than that of series-connected heating wires. That is, when a target resistance is fixed, the entire length of parallel-connected heating wires is greater than that of series-connected heating wires. Thus, when a heating wire pattern has a circular or spiral shape in a predetermined area, distances between parallel-connected heating wires can be decreased. Accordingly, a temperature difference between the area within the heating wires and the area without the heating wires can be decreased.

Furthermore, when the respective lengths of parallel-connected heating wires are different from one another, the respective resistances thereof are different from one another, whereby the respective amounts of current flowing through the heating wires are different from each other. Since the amount of heat generated from a heating wire depends on the amount of current flowing through the heating wire, the temperature of the dielectric plate 210 may be varied according to regions thereof by adjusting the respective lengths of heating wires.

If parallel-connected heating wires are embedded in a small area such as the second region 210b of the dielectric plate 210, since the entire length of the parallel-connected heating wires is large, the distance between the parallel-connected heating wires may be too small. Unlike parallel-connected heating wires, the resistance of series-connected heating wires is proportional to the length thereof. Thus, series-connected heating wires require a smaller length than parallel-connected heating wires do. Hence, to obtain a desired target resistance in a small area such as the second region 210b of the dielectric plate 210, series-connected heating wires may be embedded therein. When heating wires are arrayed in a circular or spiral pattern, as the heating wires extend toward the edge region of the dielectric plate 210, the radius of a pattern formed by the heating wires is increased. Thus, when the heating wires are connected in series, since the amount of heat generated from the heating wires per unit length is constant, the heat from the heating wires can be uniformly transferred to the entire region of the dielectric plate 210.

As described above, since the heating wires 231 to 233 connected in parallel and in series, and embedded within the dielectric plate 210 are arrayed with small and uniform intervals, heat from the heating wires 231 to 233 is uniformly transferred to the entire region of the dielectric plate 210, and the substrate W is also uniformly treated.

An electrostatic chuck is exemplified as the substrate supporting unit 200 in the above embodiments, but the substrate supporting unit 200 is not limited thereto. For example, a vacuum chuck may be exemplified as the substrate supporting unit 200, which holds a substrate by using a vacuum, or a mechanical chuck may be exemplified.

Although an etching process using plasma is exemplified in the above embodiments, a substrate treating process is not limited thereto, and thus, various substrate treating processes using plasma, such as an ashing process, a depositing process, and a cleaning process, may be exemplified.

According to the embodiments, since the entire surface of a substrate is uniformly heated, the substrate can be uniformly treated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate supporting unit comprising:
a support plate on which a substrate is placed; and
a heating member disposed within the support plate to heat the support plate,
wherein the heating member comprises:
a plurality of first heating wires disposed in a first region of the support plate; and
a plurality of second heating wires disposed in a second region of the support plate, which is different from the first region,
wherein the first and second regions of the support plate do not overlap,
wherein the first heating wires are connected to each other through one of a series connection and a parallel connection, and
wherein the second heating wires are connected to each other through the other of the series connection and the parallel connection.

2. The substrate supporting unit of claim 1, wherein the first heating wires are connected to each other in parallel, the second heating wires are connected to each other in series, and the second region has an area smaller than that of the first region.

3. The substrate supporting unit of claim 1, wherein the first region is a center region of the support plate, and
the second region is an edge region of the support plate surrounding the center region.

4. The substrate supporting unit of claim 3, wherein respective lengths of the first heating wires are greater than respective lengths of the second heating wires.

5. The substrate supporting unit of claim 3, wherein respective lengths of the first heating wires are different from each other.

6. A substrate treating apparatus comprising:
a process chamber having an inner space;
a support plate disposed within the process chamber to support a substrate; and
a heating member disposed within the support plate to heat the support plate,
wherein the heating member comprises:
a plurality of first heating wires disposed in a center region of the support plate; and
a plurality of second heating wires disposed in an edge region of the support plate surrounding the center region,
wherein the first and second regions of the support plate do not overlap,
wherein the first heating wires are connected to each other through one of a series connection and a parallel connection, and
wherein the second heating wires are connected to each other through the other of the series connection and the parallel connection.

7. The substrate treating apparatus of claim 6, wherein the first heating wires are connected to each other in parallel, the second heating wires are connected to each other in series, and the edge region has an area smaller than that of the center region.

8. The substrate treating apparatus of claim 6, wherein respective lengths of the first heating wires are greater than respective lengths of the second heating wires.

9. The substrate treating apparatus of claim 6, wherein respective lengths of the first heating wires are different from each other.

* * * * *